(12) United States Patent
Cok (10) Patent No.: US 7,825,570 B2
(45) Date of Patent: Nov. 2, 2010

(54) LED DEVICE HAVING IMPROVED CONTRAST

(75) Inventor: Ronald S. Cok, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 580 days.

(21) Appl. No.: 11/760,916

(22) Filed: Jun. 11, 2007

(65) Prior Publication Data
US 2008/0303435 A1 Dec. 11, 2008

(51) Int. Cl.
| H01J 5/16 | (2006.01) |
| H01J 61/40 | (2006.01) |
| H01J 9/24 | (2006.01) |
| H01J 9/00 | (2006.01) |
| H01J 9/26 | (2006.01) |
| H01J 9/32 | (2006.01) |
| H01K 1/30 | (2006.01) |
| H01K 1/26 | (2006.01) |
| H01L 51/52 | (2006.01) |
| H01L 51/56 | (2006.01) |

(52) U.S. Cl. .................. 313/116; 313/112; 313/117; 313/498; 313/506; 313/509; 445/24; 445/25

(58) Field of Classification Search ......... 313/495–512, 313/112, 116–117; 445/24–25
See application file for complete search history.

(56) References Cited

U.S. PATENT DOCUMENTS

| 6,683,667 B2 * | 1/2004 | Jin et al. ............... 349/113 |
| 6,770,502 B2 * | 8/2004 | Cok et al. ............... 438/40 |
| 6,787,976 B2 * | 9/2004 | Minoura et al. ......... 313/110 |
| 6,835,953 B2 * | 12/2004 | Cok et al. ............... 257/59 |
| 6,936,960 B2 | 8/2005 | Cok |
| 7,038,373 B2 * | 5/2006 | Arnold et al. ........... 313/506 |
| 7,271,536 B2 * | 9/2007 | Kimura ................ 313/504 |
| 7,339,316 B2 * | 3/2008 | Adachi et al. .......... 313/504 |
| 7,554,263 B2 * | 6/2009 | Takahashi ............. 313/506 |
| 2001/0015442 A1 * | 8/2001 | Kondoh et al. .......... 257/79 |
| 2001/0026124 A1 | 10/2001 | Liu et al. |
| 2004/0051445 A1 * | 3/2004 | Adachi ................ 313/504 |
| 2004/0061136 A1 * | 4/2004 | Tyan et al. ............ 257/200 |
| 2004/0108806 A1 * | 6/2004 | Cok et al. ............. 313/504 |
| 2004/0189167 A1 * | 9/2004 | Adachi et al. .......... 313/112 |
| 2004/0211329 A1 * | 10/2004 | Funahata et al. ........ 101/463.1 |

(Continued)

FOREIGN PATENT DOCUMENTS

JP 2000231985 A * 8/2000

(Continued)

Primary Examiner—Sikha Roy
Assistant Examiner—Jose M Diaz
(74) Attorney, Agent, or Firm—Morgan Lewis & Bockius LLP (57) ABSTRACT

A light-emitting diode (LED) device includes a reflective electrode and a transparent electrode having one or more light-emitting layers formed there-between. A contrast-enhancement element is located on a side of the transparent electrode opposite the light-emitting layer. The contrast-enhancement element has a first reflected-light absorbing layer and a second layer including transparent areas and reflective areas. The second layer is between the first reflected-light absorbing layer and the reflective electrode. A patterned light-scattering layer is located between the reflective areas of the second layer and the reflective electrode.

28 Claims, 8 Drawing Sheets

U.S. PATENT DOCUMENTS

| | | | |
|---|---|---|---|
| 2005/0088084 A1* | 4/2005 | Cok | 313/506 |
| 2005/0194896 A1* | 9/2005 | Sugita et al. | 313/506 |
| 2005/0265029 A1* | 12/2005 | Epstein et al. | 362/339 |
| 2006/0158096 A1* | 7/2006 | Adachi et al. | 313/501 |
| 2007/0069635 A1* | 3/2007 | Cok | 313/504 |
| 2007/0085471 A1* | 4/2007 | Cok | 313/503 |
| 2007/0103056 A1* | 5/2007 | Cok | 313/503 |
| 2007/0145889 A1* | 6/2007 | Tamura et al. | 313/504 |
| 2008/0048558 A1* | 2/2008 | Song et al. | 313/504 |

FOREIGN PATENT DOCUMENTS

| | | | |
|---|---|---|---|
| JP | 2002114907 A | * | 4/2002 |
| WO | 2002/037580 | | 5/2002 |
| WO | 2005/059636 | | 6/2005 |

* cited by examiner

LED DEVICE HAVING IMPROVED CONTRAST

FIELD OF THE INVENTION

The present invention relates to light-emitting diode (LED) devices, and more particularly, to LED device structures for improving light output and ambient contrast.

BACKGROUND OF THE INVENTION

Light-emitting diodes (LEDs) are a promising technology for flat-panel displays and area illumination lamps and backlights. However, LED devices typically have a highly reflective back electrode to enhance the output of emitted light through one side of the LED device. This highly reflective back electrode also reflects ambient light, thereby reducing the ambient contrast ratio of the LED device. As is known in the prior art, circular polarizers can greatly reduce the reflected ambient light, but such circular polarizers are expensive.

Significant portions of emitted light may also be trapped in LED devices. Scattering layers may be employed to improve the light emission of LED devices, but may inhibit the effectiveness of circular polarizers, and do not selectively absorb ambient light. Chou (International Publication Number WO 02/37580 A1) and Liu et al. (U.S. Patent Application Publication No. 2001/0026124 A1), e.g., taught the use of a volume or surface scattering layer to improve light extraction. The scattering layer is applied next to the organic layers in an OLED or on the outside surface of the glass substrate and has an optical index that matches these layers. Light emitted from the OLED device at higher than the critical angle that would have otherwise been trapped can penetrate into the scattering layer and be scattered out of the device. The light-emitting efficiency of the OLED device is thereby improved, but the ambient contrast is not significantly changed.

One prior-art approach to improving LED device contrast is to employ a black matrix in all non-emitting areas of an LED device, as described, for example in U.S. Pat. No. 6,936,960 entitled "OLED Displays having Improved Contrast" by Cok. The black matrix absorbs the fraction of ambient light incident upon the device between the light-emitting areas, without absorbing emitted light, thereby improving the contrast of the OLED. Generally, it is preferred to maximize the light-emitting area in an LED device to reduce the current density in the light-emitting materials and extend the lifetime of the LED. However, this reduces the amount of area available for a black matrix, thereby increasing the amount of ambient light reflected from the LED back electrode and reducing the contrast of a top-emitting LED device.

Other techniques for reducing ambient light reflection include the use of contrast enhancing films. For example, WO 2005/059636 describes a film having a plurality of waveguides separated by interstitial areas formed as narrowing recesses coated with a reflective layer. However, such a design requires small, high-precision features. Moreover, any imperfection in the reflective layer reduces the absorption of the ambient light and ambient contrast ratio of the device.

There is still a need, therefore, for an improved light-emitting diode device structure that increases the light output and ambient contrast ratio of an LED device.

SUMMARY OF THE INVENTION

The present invention is directed to a light-emitting diode (LED) device that includes a reflective electrode and a transparent electrode having one or more light-emitting layers formed there-between. A contrast-enhancement element is located on a side of the transparent electrode opposite the light-emitting layer. The contrast-enhancement element has a first reflected-light absorbing layer and a second layer including transparent areas and reflective areas. The second layer is between the first reflected-light absorbing layer and the reflective electrode. A patterned light-scattering layer is located between the reflective areas of the second layer and the reflective electrode.

Another aspect of the present invention provides a method of making an LED device, including forming, over a substrate, a reflective electrode and a transparent electrode having one or more light-emitting layers there-between. A contrast-enhancement element is located on a side of the transparent electrode opposite the light-emitting layer; the contrast-enhancement element having a first reflected-light absorbing layer and a second layer including transparent areas and reflective areas. The second layer is located between the first reflected-light absorbing layer and the reflective electrode. Finally, a patterned light-scattering layer is located between the reflective areas of the second layer and the reflective electrode.

ADVANTAGES

The present invention has the advantage that it increases the light output and ambient contrast of an LED device.

It will be understood that the figures are not to scale since the individual layers are too thin and the thickness differences of various layers too great to permit depiction to scale.

DETAILED DESCRIPTION OF THE INVENTION

Figure 1:
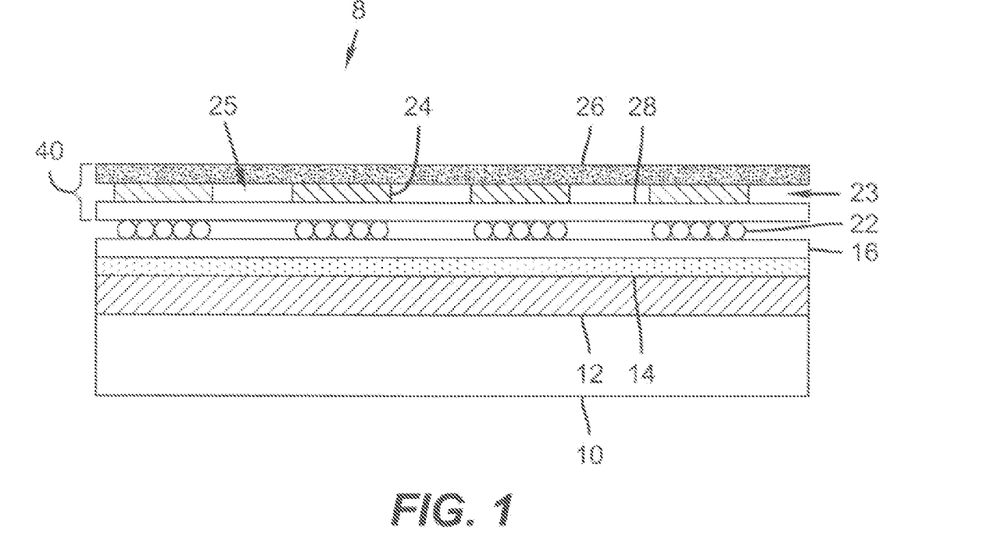
FIG. 1 illustrates a partial cross section of a top-emitter LED device having a contrast enhancement element according to an embodiment of the present invention.

Referring to FIG. 1, according to one embodiment of the present invention, a light-emitting diode (LED) device 8 comprises a substrate 10 and a reflective electrode 12 and a transparent electrode 16 formed on the substrate 10. One or more light-emitting layers 14 are formed between the electrodes 12, 16. A contrast-enhancement element 40 is located on a side of the transparent electrode 16 opposite the light-emitting layer 14, the contrast-enhancement element 40 having a first reflected-light absorbing layer 26 and a second layer 23 including transparent areas 25 and reflective areas 24, and wherein the second layer 23 is between the first reflected-light absorbing layer 26 and the reflective electrode 12. A patterned light-scattering layer 22 is located between the reflective areas 24 of the second layer 23 and the reflective electrode 12. The reflective areas 24 screen the scattering areas of the patterned light-scattering layer 22 from ambient illumination; thereby, enabling the reflective light-absorbing layer 26 to perform more efficiently (e.g., when employing a circular polarizer as the reflective light-absorbing layer 26). In one embodiment of the present invention, the first reflected-light absorbing layer 26 is a circular polarizer oriented so that ambient light reflected from the reflective areas 24 is absorbed by the circular polarizer.

Figure 2:
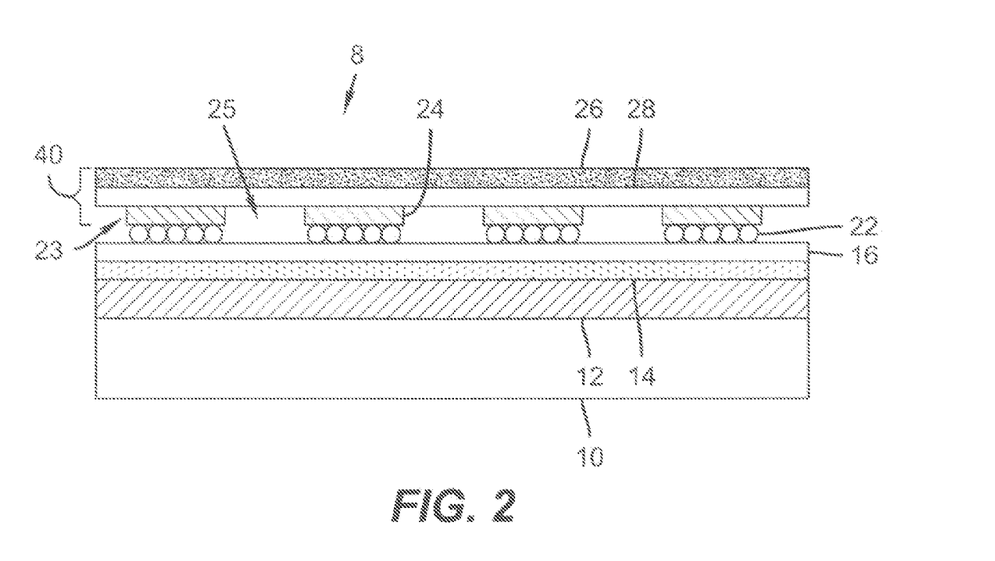
FIG. 2 illustrates a partial cross section of a top-emitter LED device having a contrast enhancement element according to another embodiment of the present invention.
Figure 3:
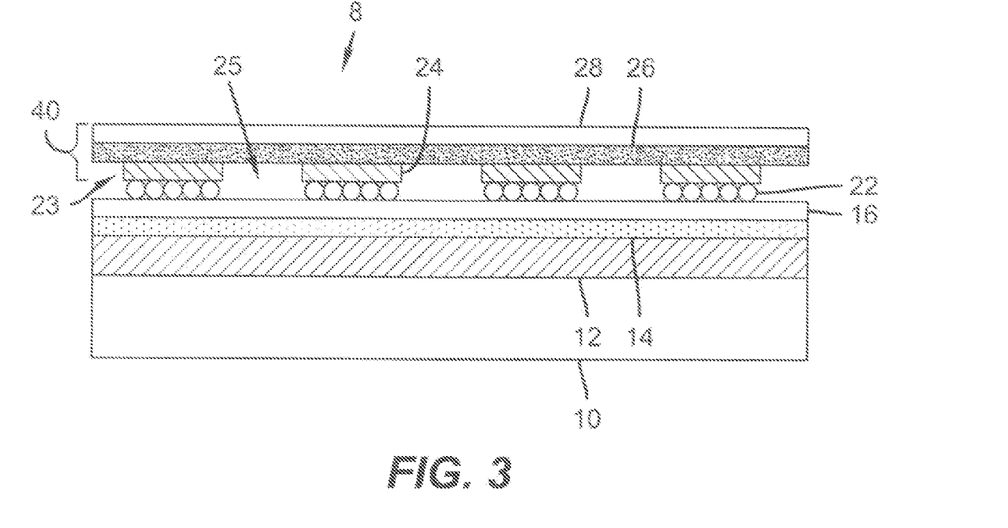
FIG. 3 illustrates a partial cross section of a top-emitter LED device having a contrast enhancement element according to yet another embodiment of the present invention.

Referring to FIGS. 1-5, a variety of embodiments of the present invention may be employed. Referring to FIGS. 1-3, in various embodiments of the present invention, the contrast-enhancement element 40 can include a transparent film 28 on which any or all of the first reflected-light absorbing layer 26, the second layer 23, or the patterned light-scattering layer 22 can be formed. In another embodiment of the present invention, the transparent film 28 can serve as a substrate, obviating the need for substrate 10.

As shown in FIG. 1, the contrast enhancement element 40 comprises a transparent film 28 having a patterned reflective layer 24 located on a side of the transparent film 28 and the reflected-light absorbing layer 26 located on the patterned reflective layer 24 on the side of the patterned reflective layer 24 opposite the transparent film 28.

As shown in FIG. 2, the contrast enhancement element 40 includes a transparent film 28 having a reflected-light absorbing layer 26 located on a first side of the transparent film 28 and a patterned reflective layer 24 formed on a second side of the transparent film 28 opposite the reflected-light absorbing layer 26.

As shown in FIG. 3, the contrast enhancement element 40 includes a transparent film 28 having the reflected-light absorbing layer 26 located on a side of the transparent film 28 and a patterned reflective layer 24 located on the reflected-light absorbing layer 26 on the side of the reflected-light absorbing layer 26 opposite the transparent film 28.

Figure 4:
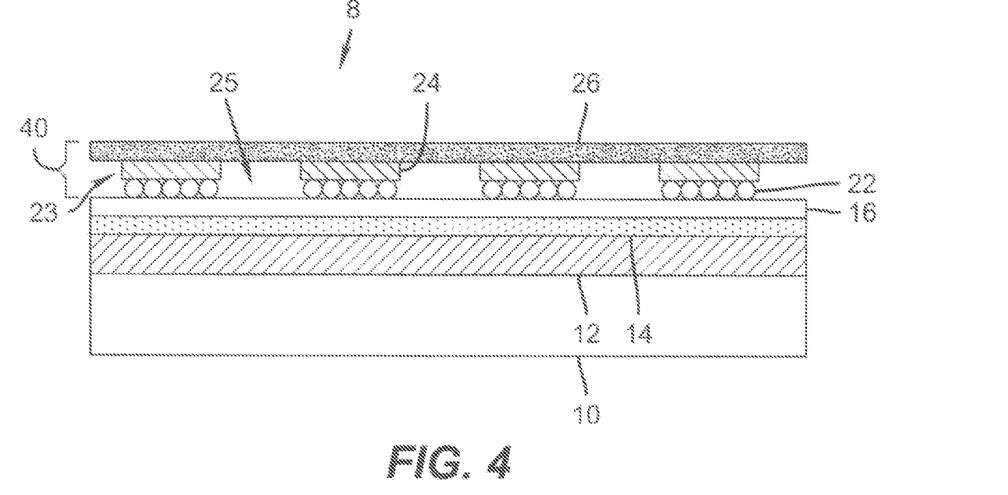
FIG. 4 illustrates a partial cross section of a top-emitter LED device having a contrast enhancement element formed without a separate transparent film according to an alternative embodiment of the present invention.

A shown in FIG. 4, the contrast enhancement element 40 includes a reflected-light absorbing layer 26 having a patterned reflective layer 24 located on a side of the reflected-light absorbing layer 26. In this embodiment, no separate transparent film layer is provided and the patterned reflective layer 24 can be formed directly on the reflected-light absorbing layer 26. The reflected-light-absorbing layer 26 is a circular polarizer.

Figure 5:
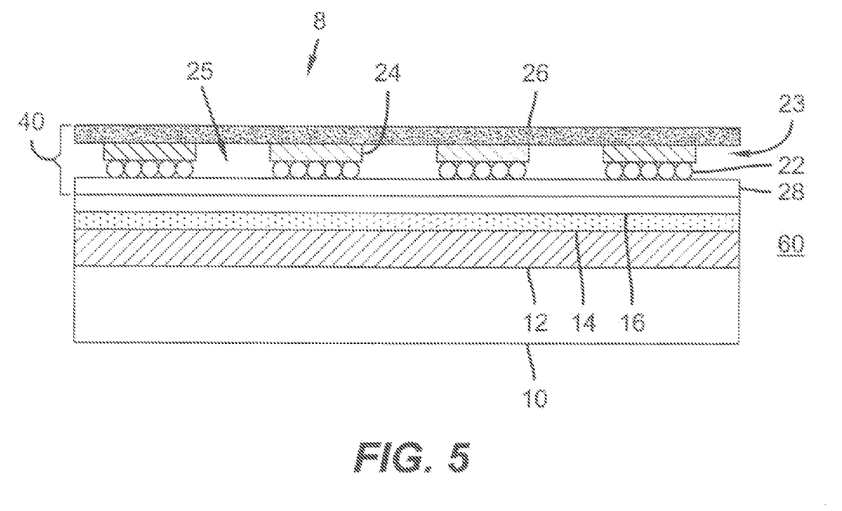
FIG. 5 illustrates a partial cross section of a top-emitter LED device having a contrast enhancement element and light-scattering layer formed over a transparent film according to an embodiment of the present invention.

Referring to FIG. 5, the patterned scattering layer 22 is formed over a transparent film 28, the patterned reflective layer 24 is located over the patterned light-scattering layer 22, and the reflected-light absorbing layer 26 is formed over the patterned reflective layer 24.

For some embodiments of the present invention wherein the patterned reflective layer 24 is not located or formed directly up on the reflected-light absorbing layer 26, hence the patterned reflective layer 24 need not be directly adjacent to the reflected-light absorbing layer 26. A gap or other separation is present between the reflected-light absorbing layer 26 and the patterned reflective layer 24.

Figure 6:
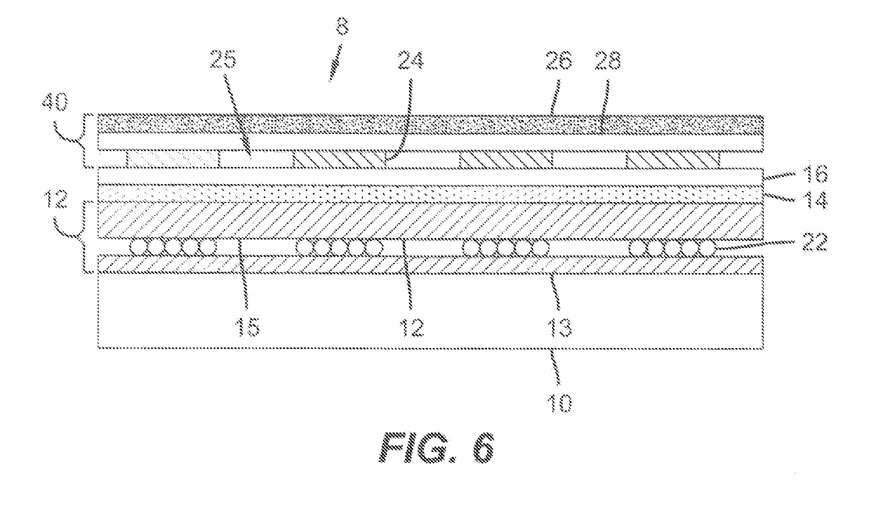
FIG. 6 illustrates a partial cross section of a top-emitter LED device having a bi-layer reflective electrode according to an embodiment of the present invention.

As shown in the embodiments of FIGS. 1-5, a top-emitter LED device includes a light-scattering layer 22 located between the transparent electrode 16 and the patterned reflective layer 24. In an alternative top-emitter embodiment shown in FIG. 6, the reflective electrode 12 comprises a reflective layer 13 and a transparent, electrically-conductive layer 15 and the patterned light-scattering layer 22 is located between the reflective layer 13 and the transparent, electrically-conductive layer 15.

Figure 7:
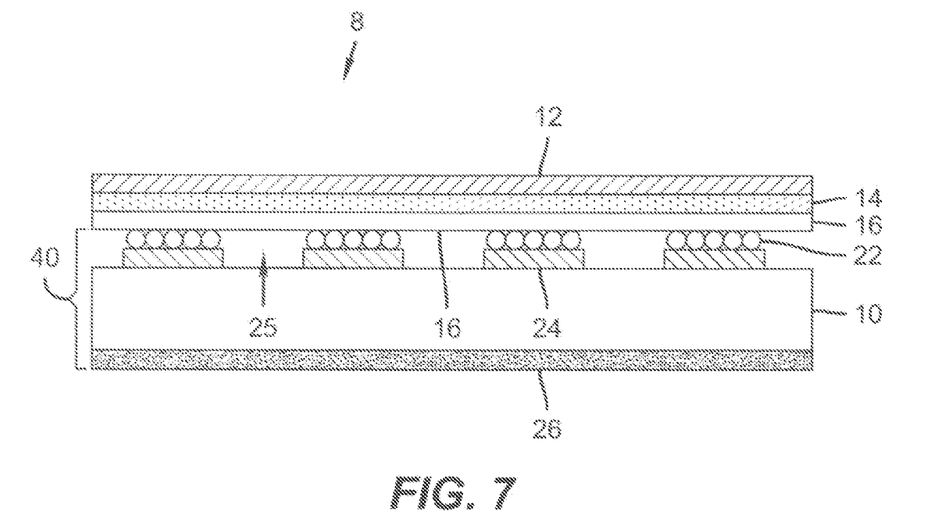
FIG. 7 illustrates a partial cross section of a bottom-emitter LED device according to an embodiment of the present invention.

The present invention can also be employed in a bottom-emitter configuration. Referring to FIG. 7, a bottom-emitter embodiment of the present invention includes a reflected-light absorbing layer 26 located on a side of a substrate 10 opposite the light-emitting layer 14 and patterned reflective layer 24. The patterned reflective layer 24 is formed on the substrate 10 and the patterned light-scattering layer 22 is between the patterned reflective layer 24 and the reflective electrode 12. In an alternative embodiment (not shown), the reflected-light absorbing layer 26 may be located between the substrate 10 and the patterned reflective layer 24.

Figure 8:
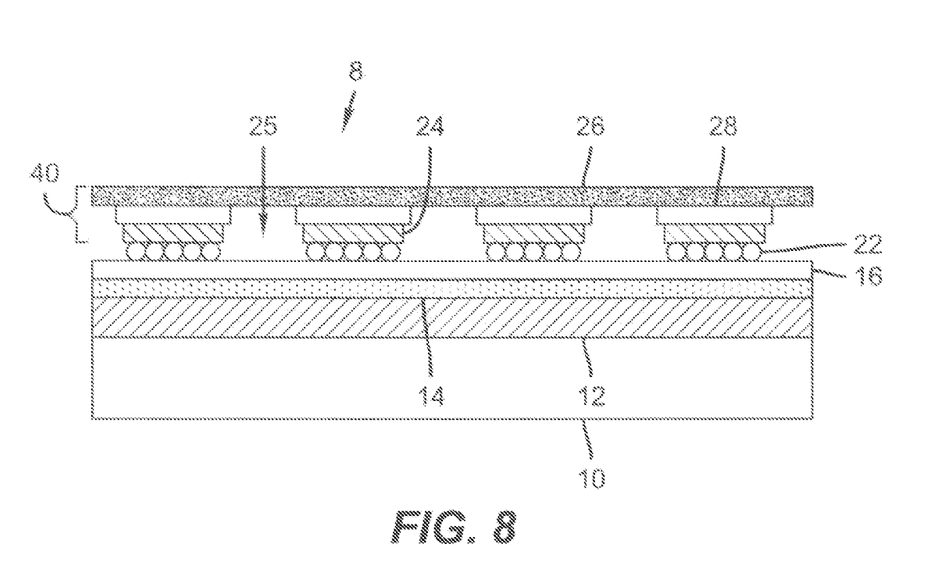
FIG. 8 illustrates a partial cross section of a top-emitter LED device having a contrast enhancement element formed over a transparent film with holes according to an embodiment of the present invention.

In one embodiment of the present invention, patterned transparent areas 25 may be holes in transparent film 28, as shown in FIG. 8. Such holes provide a low-index element, for example, having a thickness greater than 1 micron, that can be useful for maintaining the sharpness of a pixellated device in the presence of a scattering light-extraction layer as taught in co-pending, commonly assigned U.S. Ser. No. 11/065,082, filed Feb. 24, 2005, the disclosure of which is hereby incorporated by reference in its entirety. Alternatively, space between the patterned reflective areas 24 (i.e. patterned transparent areas 25) provides such a low-index element, as shown in FIGS. 1-4.

Figure 9:
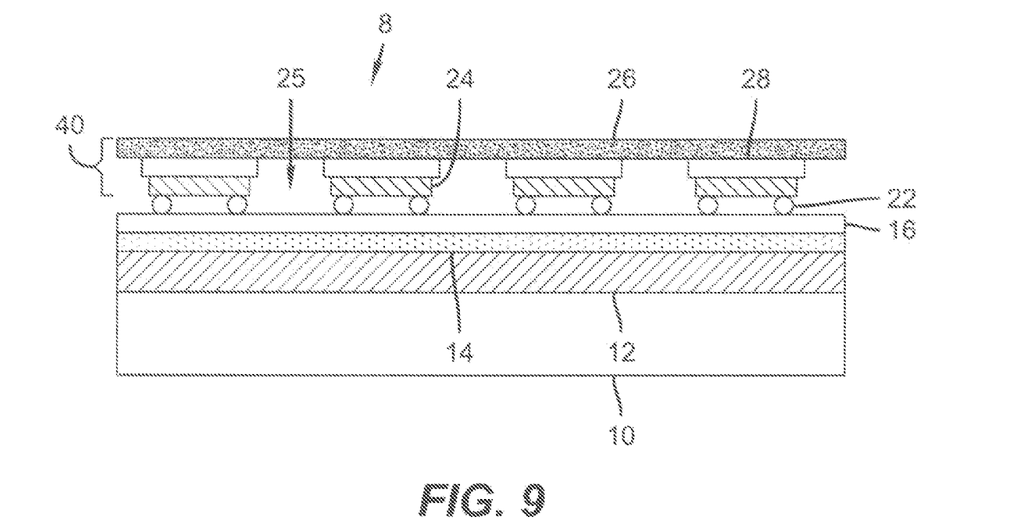
FIG. 9 illustrates a partial cross section of a top-emitter LED device having a scattering layer located in the perimeter of a reflective area according to an embodiment of the present invention.

In yet another alternative embodiment of the present invention (FIG. 9), the patterned light-scattering layer 22 is present only in the periphery of the patterned reflective layer 24. Since any light trapped under the patterned reflective layer 24 in the light-emitting layers 14 and transparent electrode 16 cannot be emitted from the device, the presence of a scattering layer 22 in that location may not be useful. When located at the periphery of the patterned reflective layer 24, the scattering layer 22 effectively scatters light through the transparent areas 25.

The components of the present invention may be formed using known processes. For example, circular polarizers are commercially available in film form, as are transparent films (e.g. made of polyethylene teraphthalate). Holes in such films may be mechanically made or formed in the film as the film is formed. Patterned reflective areas may be formed by evaporating or otherwise depositing reflective materials onto a film, for example through a mask. LED devices comprising a substrate, for example comprising glass or plastic, with an evaporated or sputtered reflective electrode (e.g. aluminum or silver or alloys thereof), light-emitting layers (e.g. organic materials such as are employed in the OLED art or inorganic materials such as quantum dots in a polycrystalline semiconductor matrix), and a transparent electrode (e.g. comprising sputtered indium tin oxide) are known.

Figure 10:
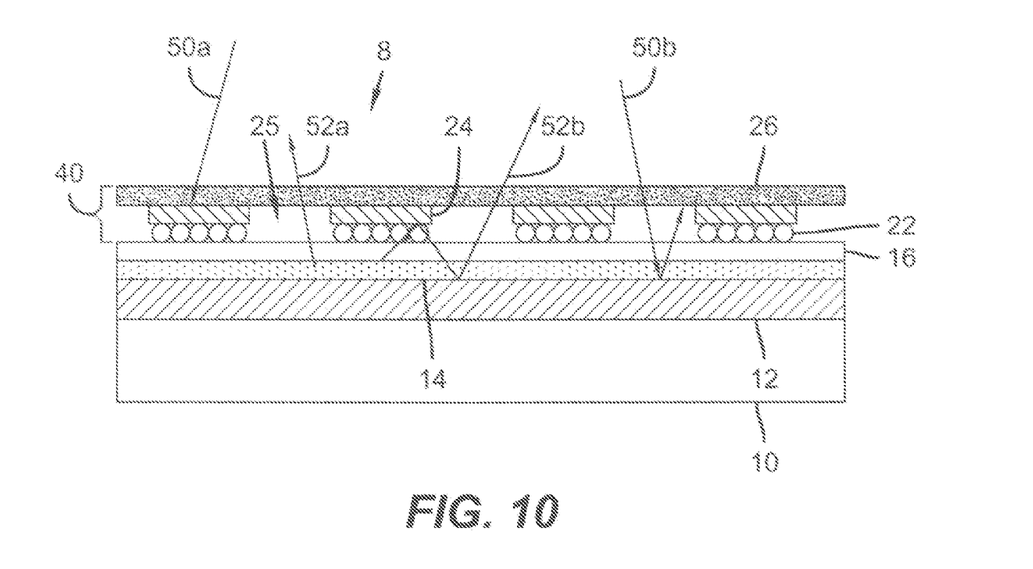
FIG. 10 illustrates the behavior of light rays in a partial cross section of a top-emitter LED device according to an embodiment of the present invention.

Referring to FIG. 10, in operation, the present invention employs a current (for example, provided by active- or passive-matrix circuitry—not explicitly shown in the Figures) passed through the light-emitting layer 14 from the electrodes 12 and 16. Emitted light 52a may be directly emitted through the transparent areas 25. Alternatively, light 52b emitted underneath the patterned reflective areas 24 may be scattered by the scattering layer 22 until it is emitted through the transparent areas 25. Trapped light that might have been waveguided in the light-emitting layers 14 and transparent electrode 16 can be scattered out of the device as light 52b. Ambient light 50a incident on the device 8 over the light-reflective areas 24 is reflected and then absorbed by the reflected-light absorbing layer 26. Ambient light 50b incident on the device 8 over the transparent areas 26 passes through the transparent areas 25, the transparent electrode 16, and the light-emitting layer 14, to be reflected by the reflective electrode 12 and then absorbed by the reflected-light absorbing layer 26. Hence, according to the present invention, the ambient light is absorbed while emitted light escapes from the LED device, providing an LED device with improved ambient contrast.

Figure 11:
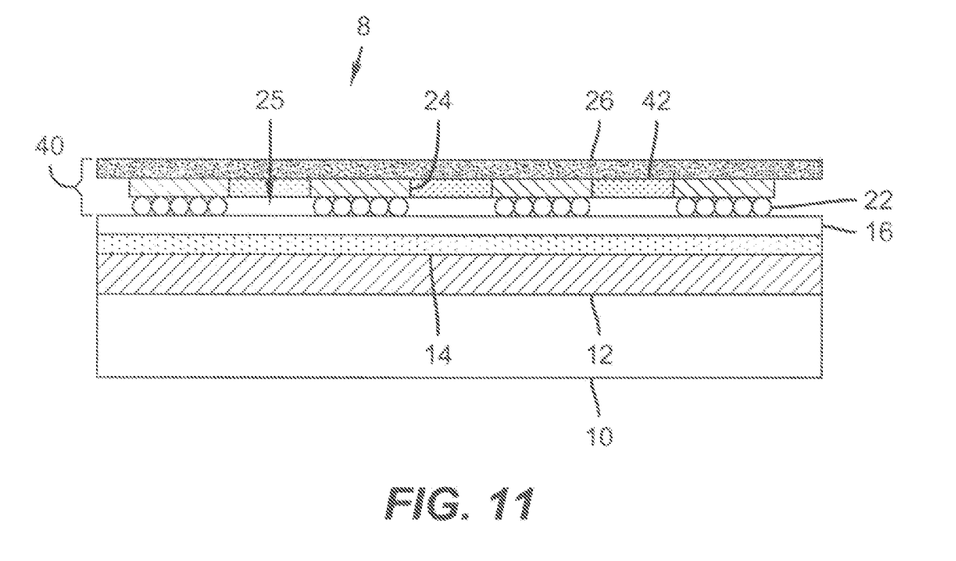
FIG. 11 illustrates a partial cross section of a top-emitter LED device having color filters according to an embodiment of the present invention.

Referring to FIG. 11, color filters 42 are employed to color the emitted light. Such color filters 42 are located in the transparent areas 25 to filter the emitted light. (Such color filters are transparent to the desired frequency of emitted light). Color filters are known in the art and may include, for example, pigments or dyes formed in or on a base material, for example film or various protective layers such as glass, silicon or silicon-based materials, polymers, or metal oxides. The color filters may be formed in a layer and a variety of colors provided in different locations in the layer. Means to deposit such color filters on transparent films or glass substrates are also known. Alternatively, a color filter layer may be located over the entire extent of the LED light-emitting area under the contrast enhancement element 40. The color filter layer may be formed over the contrast enhancement layer 40, or on a transparent electrode or any protective or encapsulating layers formed on a transparent electrode or formed on the cover or substrate of a top-emitting or bottom-emitting LED device, respectively. The color filter layer may be located between the scattering layer 22 and the contrast enhancement element 40. In this case, both emitted and ambient light that is reflected within the OLED device may pass through the filter multiple times. The light-emitting layers 14 may emit either a colored light or a broadband (primarily white) light and the color filter can be employed to provide an appropriate color of light, for example to provide a full-color LED display.

In any practical implementation of a useful LED device, there should be at least one transparent area in the contrast enhancement element for each light-emitting area, although multiple transparent openings may be preferred. Hence, the minimum number of areas and the maximum spacing of the openings are limited by the LED device. In general, it is useful to have several transparent openings 25 per light-emitting area or pixel. The size and shape of the openings are not critical and can be determined by practical limitations in the manufacture of the contrast enhancement element. If the contrast enhancement element 40 has a sufficient number of transparent openings 25, the transparent film 28 need not be aligned to the LED device 8. The contrast enhancement element 40 may be in contact with both or either the cover and the top layer of the LED device 8. In this way, a readily manufacturable solid-state structure having excellent mechanical stability can be formed.

Figure 12A:
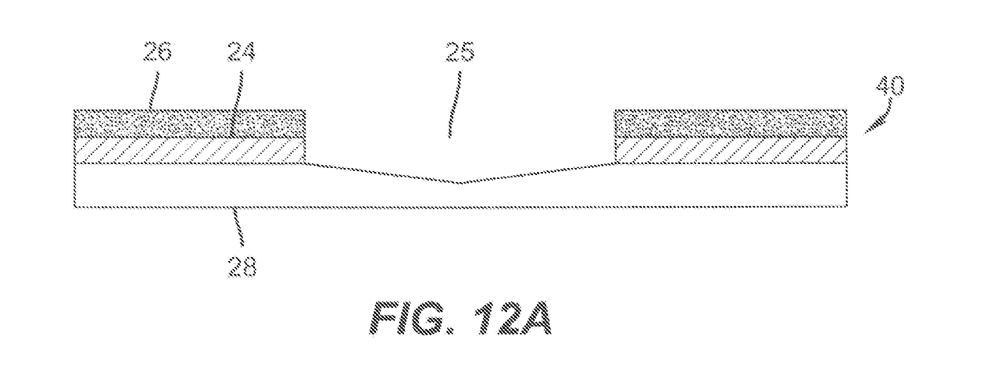
FIGS. 12a-12c illustrate various structures within a partial cross section of transparent and reflective areas according to an embodiment of the present invention.
Figure 12B:
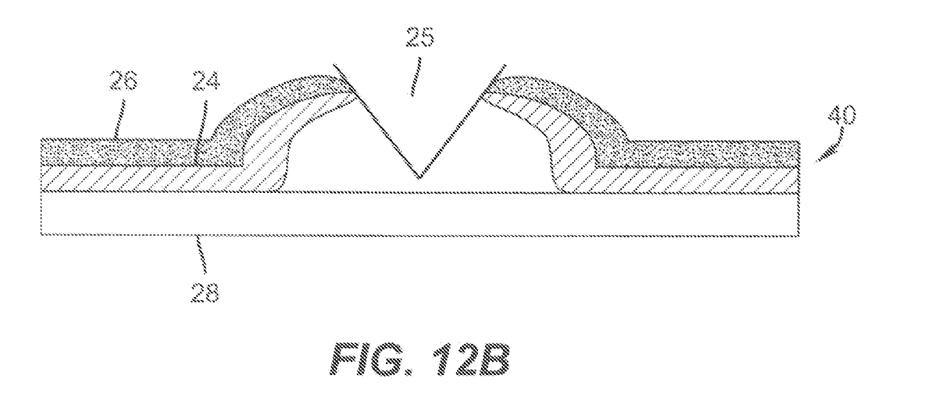
Figure 12C:
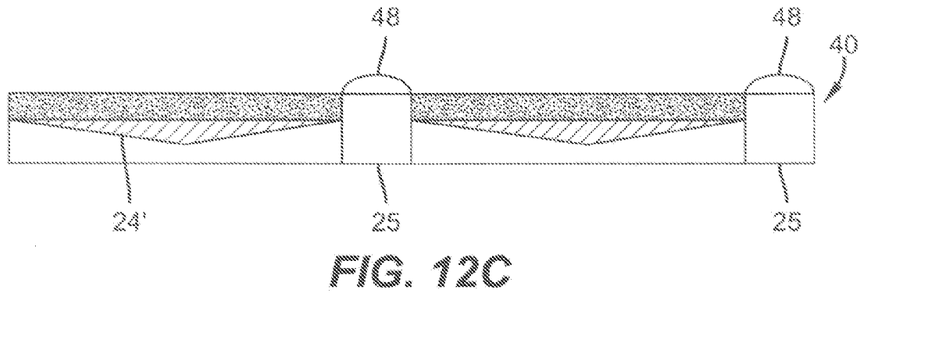

To enhance the performance of the contrast enhancement element 40, it may be possible to structure the patterned reflective areas 24 or the transparent areas 25. The reflective layer 24 may form a planar reflective surface, an angled segmented reflective surface, or a curved reflective surface. Alternatively, referring to FIG. 12a, the transparent film 28 may be structured to enhance the light output from light traveling in the transparent film 28. The transparent film 28 can include structures having depressions or projections, for example cones, pyramids, hemispheres, or tetrahedrons, or portions of such structures, cut into the film surface (as shown in FIG. 12a). Alternatively as shown in FIG. 12b, additional material may be provided on the surface of transparent film 28 to construct depressions or projections such as cones, pyramids, hemispheres, ellipsoids, or tetrahedrons or portions of such structures. Referring to FIG. 12c, the structured surface on the transparent film 28 forms a structured reflector 24' and/or the additional materials may form, for example, lenslets 48 or axicons that may improve the light output or contrast of the contrast enhancement film 40.

A transparent low-index element (possibly an air gap) having a refractive index lower than the refractive index of an encapsulating cover or substrate through which light is emitted from the LED device; and lower than the refractive index range of the LED light-emitting layer materials, can be employed between the transparent electrode 16 and the substrate or cover in combination with a scattering layer to improve the sharpness of the OLED device. In accordance with the present invention, such a low-index layer may be incorporated into the contrast enhancement element 40. The openings in the contrast enhancement element 40, e.g., may form a low-index element having a refractive index lower than the refractive index range of the organic layers, and the substrate or cover through which light is emitted. In this embodiment, the low-index element is between the scattering layer and the substrate or cover through which light is emitted. If the opening in the contrast enhancement element 40 is not a transparent polymer or glass, for example, but is filled with a gas or vacuum, the gas or vacuum will provide a low-index layer useful in preserving the sharpness of a multi-pixel LED device 8. Hence, a transparent opening 25 in the contrast enhancement film 40 may serve as a low-index layer. Since the low-index element has an optical index lower than that of any LED elements and the cover or substrate through which light is emitted, any light that is scattered into the low-index layer by the light-scattering layer 22 will pass through the layer and the cover or substrate. Light passing from a low-index material into a higher index material (the cover or substrate) cannot experience total internal reflection.

When employed, the light-scattering layer 22 should be optically integrated with the light emitters in order to effectively enhance the light output of the LED device. The term 'optically integrated' means that there are no intervening layers having an optical index lower than the optical index of any of the light-emitting and transparent electrode layers, and that light that passes through any one of the layers will encounter the scattering layer. The one or more light-emitting layers may include one or more of the following layers: a hole-injection layer, hole-transport layer, electron-injection layer, electron-transport layer, and a light-emitting layer. More than one light-emitting layer can be employed in the present invention, for example to create a white light output. These layers are well known in the LED art. Although LED layer structures are more typically described with a cathode on the top and an anode on the bottom near the substrate, it is well known that the layers can be inverted and the positions of the anode and cathode exchanged. Such inverted structures are included in the present invention.

In some embodiments, the contrast enhancement element is partially, largely, or completely co-extensive with either the transparent electrodes to maximize the contrast and light output of the LED device.

Various conductive and scattering materials useful in the present invention, as well as the employment of light-scattering layers for extracting additional light from the device are described in more detail in co-pending, commonly assigned U.S. Ser. No. 11/065,082, filed Feb. 24, 2005, the disclosure of which is incorporated herein by reference in its entirety. Additional layers may be usefully employed with the present invention. For example, one problem that may be encountered with light-scattering layers is that the light-emitting materials may not prevent the electrodes from shorting near the sharp edges associated with the scattering elements in the light-scattering layer 22. Although the light-scattering layer 22 may be planarized, typically such planarizing operations do not form a perfectly smooth, defect-free surface. To reduce the possibility of shorts between the electrodes, a short-reduction layer (not shown) may be employed between an electrode and the light-emitting layers, when the electrode is formed over the light-scattering layer. Such a layer is a thin layer of high-resistance material (for example, having a through-thickness resistivity between $10^{-7}$ ohm-$cm^2$ to $10^3$ ohm-$cm^2$). Because the short-reduction layer is very thin, device current can pass between the electrodes through the device layers, but leakage current through the shorts are significantly reduced. Such layers are described in co-pending, commonly assigned U.S. Ser. No. 10/822,517, filed Apr. 12, 2004, the disclosure of which is incorporated herein by reference in its entirety.

Figure 13:
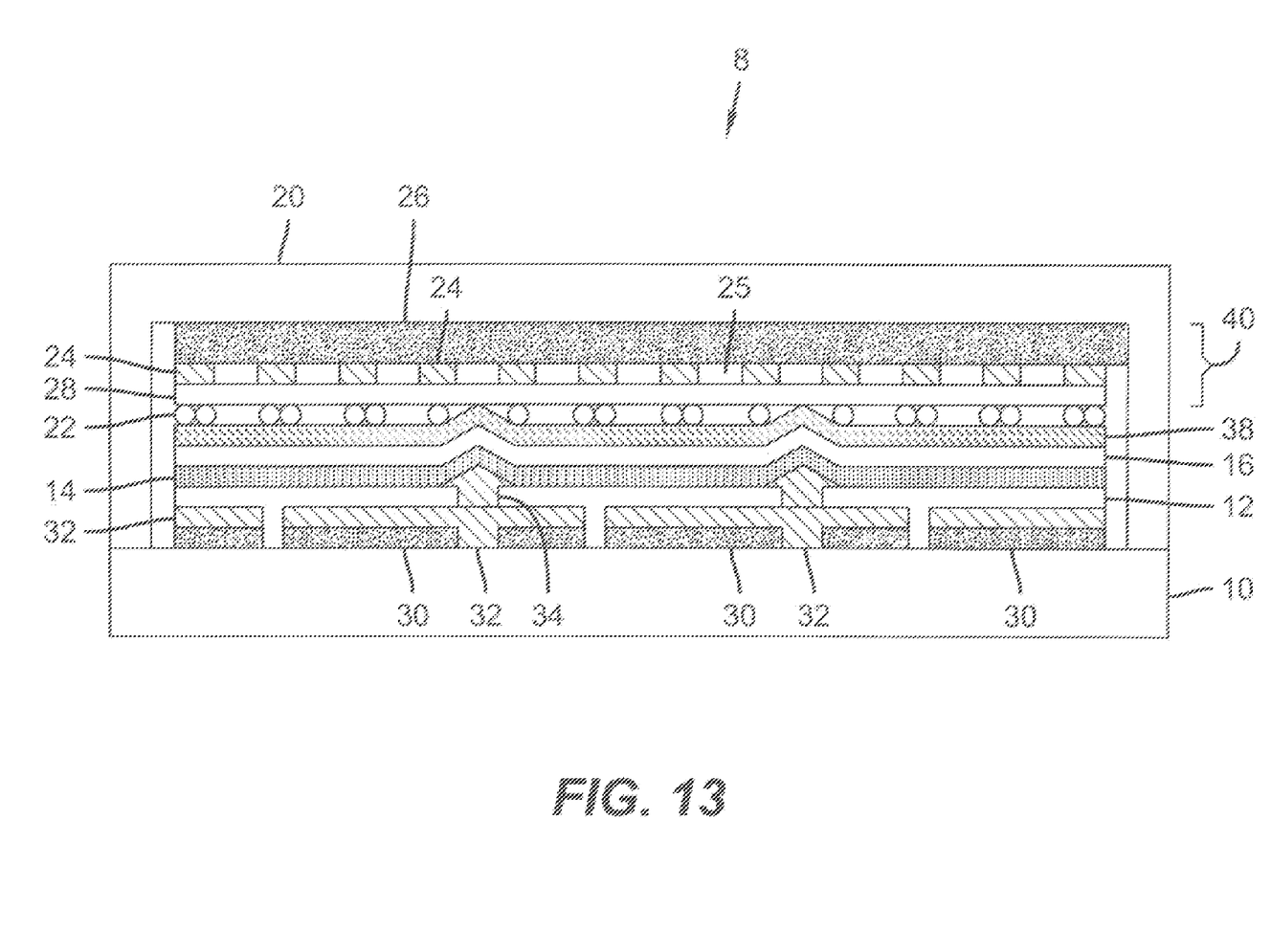
FIG. 13 illustrates a cross section of a top-emitter LED device according to an embodiment of the present invention.

The present invention improves the performance of an active-matrix OLED device employing patterned electrodes to control light emission from a plurality of light-emitting pixel areas. Referring to FIG. 13, a top-emitting pixellated LED device 8 according to an embodiment of the present invention is illustrated having a substrate 10 (either reflective, transparent, or opaque). Over the substrate 10, a semi-conducting layer is formed providing thin-film electronic components 30 for driving an LED. An interlayer insulating and planarizing layer 32 is formed over and between the thin-film electronic components 30 and a first patterned reflective metal electrode 12 defining LED light-emissive pixels is formed over the insulating layer 32. Such metal electrodes 12 are typically formed by evaporating or sputtering metal in a photolithographic process. An inter-pixel insulating film 34 separates the elements of the patterned reflective metal electrode 12. One or more first layers 14 of light-emissive materials described above, one or more of which together emits broadband light, are formed over the patterned reflective metal electrode 12. In the case of organic LEDs, such light-emissive layers 14 are typically formed by evaporation through a mask. A transparent second electrode 16 (typically formed by sputtering ITO) is formed over the one or more first layers 14 of organic material. The first reflective electrode 12 may instead be at least partially transparent and/or light absorbing. Typically, the reflective metal electrode 12 comprises Al, Ag, Mg, or alloys of these or other reflective metals. The transparent electrode 16 may comprise ITO or other transparent and conductive metal oxides.

An optional protective layer 38, for example, comprising aluminum oxide and/or parylene, may be formed over the transparent electrode 16, by atomic deposition or chemical vapor deposition or a combination thereof. A patterned light-scattering layer 22 is formed over the protective layer 38, for example, by inkjet deposition. A contrast enhancement 40 element is formed separately and has a reflected-light absorbing layer 26 and a plurality of transparent areas 25 and reflective areas 24 coated on transparent film 28. The reflected-light absorbing layer 26 and reflective areas 24 need not necessarily be in physical contact. A cover 20 may be placed over and in contact with the contrast enhancement layer 40.

OLED devices of this invention can employ various well-known optical effects in order to enhance their properties, if desired. This includes optimizing layer thicknesses to yield maximum light transmission, providing dielectric mirror structures, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over or as part of the cover or substrate.

The present invention can be practiced with either active- or passive-matrix OLED devices, and is particularly useful in display devices. In one embodiment, the present invention is employed in a flat-panel OLED device composed of small molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST

8 OLED device
10 substrate
12 reflective electrode
13 reflective layer
14 light-emitting layer(s)
15 transparent conductive layer
16 transparent electrode
20 cover
22 light-scattering layer
23 second layer
24, 24' reflective areas
25 transparent areas
26 reflected-light-absorbing layer
28 transparent film
30 thin-film circuitry
32 insulator
34 insulator
38 protective layer
40 contrast enhancement element
42 color filter
48 lenslet
50a, 50b ambient light rays
52a, 52b emitted light ray

The invention claimed is:

1. A light-emitting diode (LED) device, comprising: a substrate; a reflective electrode comprising a reflective layer and a transparent, electrically-conductive layer and a transparent electrode having one or more light-emitting layers formed there-between formed over the substrate, the overlap of the reflective electrode, the transparent electrode and the one or more light-emitting layers defining a plurality of light-emitting areas; a contrast-enhancement element located over the substrate on a side of the transparent electrode opposite the light-emitting layer, the contrast-enhancement element having a first reflected-light absorbing layer and a second layer including transparent areas and reflective areas and wherein the second layer is between the first reflected-light absorbing layer and the reflective electrode; and a patterned light-scattering layer located in only a portion of each of the reflective areas of the second layer over the substrate between the reflective areas and the reflective electrode, wherein the patterned light-scattering layer is located between the reflective layer and the transparent, electrically-conductive layer.

2. The light-emitting diode device of claim 1 wherein the first reflected-light absorbing layer is a circular polarizer.

3. The light-emitting diode device of claim 1 wherein the contrast enhancement element includes a reflected-light absorbing layer having a patterned reflective layer located on a side of the reflected-light absorbing layer.

4. The light-emitting diode device of claim 1 wherein the contrast enhancement element includes a transparent film having a patterned reflective layer located on a side of the transparent film and the reflected-light absorbing layer located on the patterned reflective layer on the side of the patterned reflective layer opposite the transparent film.

5. The light-emitting diode device of claim 1 wherein the contrast enhancement element comprises a transparent film having a reflected-light absorbing layer located on a first side of the transparent film and a patterned reflective layer formed on a second side of the transparent film opposite the reflected-light absorbing layer.

6. The light-emitting diode device of claim 1 wherein the contrast enhancement element comprises a transparent film having the reflected-light absorbing layer located on a side of the transparent film and a patterned reflective layer located on the reflected-light absorbing layer on the side of the reflected-light absorbing layer opposite the transparent film.

7. The light-emitting diode device of claim 1 wherein the scattering layer is formed over a transparent film, the patterned reflective layer is located over the patterned light-scattering layer, and the reflected-light absorbing layer is formed over the patterned reflective layer.

8. The light-emitting diode device of claim 1 wherein the light-emitting diode device is a top-emitting device.

9. The light-emitting diode device of claim 1 wherein the light-emitting diode device is a bottom-emitting device.

10. The light-emitting diode device of claim 1, wherein the contrast-enhancement element comprises a film having holes forming the transparent areas.

11. The light-emitting diode device of claim 1, wherein the scattering layer is located in the perimeter of the reflective areas.

12. The light-emitting diode device of claim 1, further comprising a low-index element between the transparent electrode and the reflected-light absorbing layer.

13. The light-emitting diode device of claim 1, further comprising a color filter located in the transparent areas.

14. The light-emitting diode device of claim 1, wherein the transparent areas in the second layer form optically refractive or reflective geometrical structures, or form a low-index element.

15. The light-emitting diode device of claim 14, wherein the refractive or reflective geometrical structures include conic, pyramidal, spherical, elliptical, and tetrahedral structures or portions of such structures.

16. The light-emitting diode device of claim 1, wherein a plurality of either of the transparent or reflective electrodes is patterned over a substrate and a plurality of transparent or reflective areas are patterned over each patterned electrode.

17. A method of making a light-emitting diode (LED) device, including the steps of: providing a substrate; forming, over the substrate, a reflective electrode comprising a reflective layer and a transparent, electrically-conductive layer and a transparent electrode having one or more light-emitting layers there-between, the overlap of the reflective electrode, the transparent electrode and the one or more light-emitting layers defining a plurality of light-emitting areas; locating a contrast-enhancement element on the substrate on a side of the transparent electrode opposite the light-emitting layer, the contrast-enhancement element having a first reflected-light absorbing layer and a second layer including transparent areas and reflective areas and wherein the second layer is between the first reflected-light absorbing layer and the reflective electrode; and locating a patterned light-scattering layer in only a portion of each of the reflective areas of the second layer on the substrate between the reflective areas and the reflective electrode, wherein the patterned light-scattering layer is located between the reflective layer and the transparent, electrically-conductive layer.

18. The method of claim 17, wherein the contrast-enhancement element comprises a film and the first reflected-light absorbing layer is a circular polarizer.

19. A light-emitting diode (LED) device, comprising: a substrate; a reflective electrode and a transparent electrode having one or more light-emitting layers formed there-between formed over the substrate, the overlap of the reflective electrode, the transparent electrode and the one or more light-emitting layers defining a plurality of light-emitting areas; a contrast-enhancement element located over the substrate on a side of the transparent electrode opposite the light-emitting layer, the contrast-enhancement element having a first reflected-light absorbing layer and a second layer including transparent areas and reflective areas and wherein the second layer is between the first reflected-light absorbing layer and the reflective electrode; and a patterned light-scattering layer located over the substrate only between a portion of each of the reflective areas of the second layer and the reflective electrode.

20. The light-emitting diode device of claim 19, wherein the scattering layer is located in the perimeter of the reflective areas.

21. The light-emitting diode device of claim 19, further comprising a low-index element between the transparent electrode and the reflected-light absorbing layer.

22. A light-emitting diode (LED) device, comprising: a substrate; a reflective electrode and a transparent electrode having one or more light-emitting layers formed there-between formed over the substrate, the overlap of the reflective electrode, the transparent electrode and the one or more light-emitting layers defining a plurality of light-emitting areas; a contrast-enhancement element located over the substrate on a side of the transparent electrode opposite the light-emitting layer, the contrast-enhancement element having a first reflected-light absorbing layer and a second layer including transparent areas and reflective areas and wherein the second layer is between the first reflected-light absorbing layer and the reflective electrode; and a patterned light-scattering layer located in only a portion of each of the reflective areas of the second layer over the substrate between the reflective areas and the reflective electrode, wherein a plurality of either of the transparent or reflective electrodes is patterned over the substrate and a plurality of transparent or reflective areas are patterned over each patterned electrode.

23. A method of making a light-emitting diode (LED) device, including the steps of: providing a substrate; forming, over the substrate, a reflective electrode and a transparent electrode having one or more light-emitting layers there-between, the overlap of the reflective electrode, the transparent electrode and the one or more light-emitting layers defining a plurality of light-emitting areas; locating a contrast-enhancement element on the substrate on a side of the transparent electrode opposite the light-emitting layer, the contrast-enhancement element having a first reflected-light absorbing layer and a second layer including transparent areas and reflective areas and wherein the second layer is between the first reflected-light absorbing layer and the reflective electrode; and locating a patterned light-scattering layer on the substrate only between a portion of each of the reflective areas of the second layer and the reflective electrode.

24. The method of claim 23, wherein the contrast-enhancement element comprises a film and the first reflected-light absorbing layer is a circular polarizer.

25. The method of claim 23, wherein the step of locating a patterned light-scattering layer further comprises locating the scattering layer in the perimeter of the reflective areas.

26. The method of claim 23 further comprising the step of locating a low-index element between the transparent electrode and the reflected-light absorbing layer.

27. A method of making a light-emitting diode (LED) device, including the steps of: forming, over the substrate, a reflective electrode and a transparent electrode having one or more light-emitting layers there-between, the overlap of the reflective electrode, the transparent electrode and the one or more light-emitting layers defining a plurality of light-emitting areas; locating a contrast-enhancement element on the substrate on a side of the transparent electrode opposite the light-emitting layer, the contrast-enhancement element having a first reflected-light absorbing layer and a second layer including transparent areas and reflective areas and wherein the second layer is between the first reflected-light absorbing layer and the reflective electrode; and locating a patterned light-scattering layer on the substrate only between a portion of each of the reflective areas of the second layer and the reflective electrode.

28. The method of claim 27, wherein the contrast-enhancement element comprises a film and the first reflected-light absorbing layer is a circular polarizer.

* * * * *